United States Patent [19]

Sinclair et al.

[11] Patent Number: 5,814,819
[45] Date of Patent: Sep. 29, 1998

[54] SYSTEM AND METHOD FOR NEUTRALIZING AN ION BEAM USING WATER VAPOR

[75] Inventors: Frank Sinclair, Quincy; Victor Benveniste, Gloucester; Jiong Chen, Beverly, all of Mass.

[73] Assignee: Eaton Corporation, Cleveland, Ohio

[21] Appl. No.: 891,688

[22] Filed: Jul. 11, 1997

[51] Int. Cl.$^6$ ................................................ H01J 27/02
[52] U.S. Cl. ......................................... 250/492.21; 250/251
[58] Field of Search .................................. 250/492.21, 251

[56] References Cited

U.S. PATENT DOCUMENTS

| | | | |
|---|---|---|---|
| 5,164,599 | 11/1992 | Benveniste | 250/492.2 |
| 5,492,862 | 2/1996 | Misumi | 437/173 |
| 5,531,420 | 7/1996 | Benveniste | 250/251 |
| 5,576,538 | 11/1996 | Sakai et al. | 250/251 |
| 5,670,785 | 9/1997 | Kitamura | 250/472.21 |

Primary Examiner—Kiet T. Nguyen
Attorney, Agent, or Firm—John A. Kastelic

[57] ABSTRACT

An improved ion beam neutralizer (22) is provided for neutralizing the electrical charge of an ion beam (28) output from an extraction aperture (50). The neutralizer comprises a source of water (52); a vaporizer (54) connected to the source of water; a mass flow controller (56) connected to the vaporizer; and an inlet (60) connected to the mass flow controller. The vaporizer (54) converts water from the source (52) from a liquid state to a vapor state. The mass flow controller (56) receives water vapor from the vaporizer (54) and meters the volume of water vapor output by a mass flow controller outlet (66). The inlet (60) is provided with an injection port (68) located proximate the ion beam extraction aperture (50) and receives the metered volume from the outlet (66). The injection port (68) is positioned near the extraction aperture so that the ion beam and the water vapor interact to neutralize the ion beam. The improved ion beam neutralizer (22) is especially effective in low energy (less than ten kilo-electron volts (10 KeV)) beam applications.

16 Claims, 2 Drawing Sheets

SYSTEM AND METHOD FOR NEUTRALIZING AN ION BEAM USING WATER VAPOR

FIELD OF THE INVENTION

The present invention relates generally to the field of ion implanters, and more specifically to an improved system and method for neutralizing an ion beam in an ion implanter using water vapor as the neutralizing medium.

BACKGROUND OF THE INVENTION

Ion implantation has become the technology preferred by industry to dope semiconductors with impurities in the large scale manufacture of integrated circuits. Ion dose and ion energy are the two most important variables used to define an implant step. Ion dose relates to the concentration of implanted ions for a given semiconductor material. Typically, high current implanters (generally greater than 10 milliamps (mA) ion beam current) are used for high dose implants, while medium current implanters (generally capable of up to about 1 mA beam current) are used for lower dose applications.

Ion energy is used to control junction depth in semiconductor devices. The energy levels of the ions which make up the ion beam determine the degree of depth of the implanted ions. High energy processes such as those used to form retrograde wells in semiconductor devices require implants of up to a few million electron volts (MeV), while shallow junctions may only demand energies below one thousand electron volts (1 KeV).

A typical ion implanter comprises three sections or subsystems: (i) an ion source for outputting an ion beam, (ii) a beamline including a mass analysis magnet for mass resolving the ion beam, and (iii) a target chamber which contains the semiconductor wafer or other substrate to be implanted by the ion beam. The continuing trend toward smaller and smaller semiconductor devices requires a beamline construction which serves to deliver high beam currents at low energies. The high beam current provides the necessary dosage levels, while the low energy levels permit shallow implants. Source/drain junctions in semiconductor devices, for example, require such a high current, low energy application.

Low energy beams which propagate through a given beamline construction suffer from a condition known as beam "blow-up", which refers to the tendency for like-charged (positive) ions within the ion beam to mutually repel each other (also known as the space charge effect). Such mutual repulsion causes a beam of otherwise desired shape to diverge away from an intended beamline path. Beam blow-up is particularly problematic in high current, low energy applications because the high concentration of ions in the beam (high current) exaggerates the force of the mutual repulsion of the ions, and the minimal propagation velocity (low energy) of the ions expose them longer to these mutually repulsive forces.

A mechanism by which the space charge effect is reduced in an ion implanter is the creation of a beam plasma, comprised of positively charged, negatively charged, and neutral particles, wherein the charge density of the positively and negatively charged particles within the space occupied by the beam are the same. A beam plasma is generally created when the positively charged ion beam interacts with residual background gas atoms, producing ion electron pairs by way of ionizing collisions. The ion beam is thereby partially neutralized by means of its interaction with the background residual gas in its flight path. Typically, although the beamline is operating under vacuum conditions, the background residual gas that remains is that which has not been removed by high vacuum pumps, often existing at extremely low pressures (less than 1 milliTorr ($10^{-3}$ Torr)).

Because the extent of ion beam neutralization resulting from this beam/background gas interaction is insufficient to support high current beams at low energies, more active space charge neutralization schemes are utilized to supplement this interaction. One manner of providing an active neutralization scheme is to control the composition of the background gas, which is one factor that determines the extent of beam neutralization, by directly injecting gas into the beamline through which the ion beam propagates.

A known active beam neutralization scheme is to introduce gaseous nitrogen (or, for example, argon, neon or xenon) into the implanter beamline at the location of the mass analysis magnet. The slow introduction (bleeding) of nitrogen into the beamline increases the number of background gas particles with which the positively charged ion beam may interact. Nitrogen bleeding has been found to boost the current levels at which arsenic and phosphorous ion beams may be transported under low energy (less than 10 KeV) conditions. However, nitrogen bleeding does little to raise the current levels of a boron ion beam under low energy conditions, and in some instances, has served to reduce the boron ion beam current level under these conditions.

The ineffectiveness of nitrogen bleeding on a high current, low energy boron ion beam is explained by the phenomenon of charge exchange. The interaction of the beam with the background gas, in addition to creating the beam plasma as explained above, also cause this charge exchange which is characterized by (i) the acquisition of electrons by the highly energetic positively charged boron ions from the background gas and (ii) the loss of electrons by the non-energetic neutral background gas. Thus, energetic neutral boron particles are produced along with slow moving, non-energetic, positively charged gas ions. The energetic neutral boron particles are lost in the mass analysis magnet which functions to pass only particles of an appropriate charge-to-mass ratio. Accordingly, the amount of beam current is reduced.

Boron is especially susceptible to the charge exchange effect because boron atoms have a larger cross section than, for example, arsenic and phosphorous. Therefore, known gases which are bled into the path of a boron ion beam result in significant charge exchange. In addition, at low beam energy levels, a large number of gas particles (or a high pressure of gas) is required to effectively neutralize the beam, which also results in increased charge exchange. Thus, conventional gas bleeding is limited in certain low energy applications such as boron ion beam transport.

Accordingly, it is an object of the present invention to provide a method and system for neutralizing an ion beam to counteract the space charge effect thereof, while maximizing the beam current which is transportable under low energy conditions.

It is a further object of the invention to provide an ion beam neutralization system and method which is implemented near the ion source at a point wherein beam density and beam current is maximum.

It is still a further object of the invention to provide an ion beam neutralization system and method which is particularly useful in neutralizing boron ion beams.

It is yet a further object of the invention to provide an ion beam neutralization system and method wherein a non-toxic, non-contaminating neutralizing medium is utilized.

SUMMARY OF THE INVENTION

An improved ion beam neutralizer and method for neutralizing an ion beam in an ion implanter is provided. The neutralization system comprises a source of water; a vaporizer connected to the source of water; a mass flow controller connected to the vaporizer; and an inlet connected to the mass flow controller. The vaporizer converts water from the source from a liquid state to a vapor state. The mass flow controller receives water vapor from the vaporizer and meters the volume of water vapor output by a mass flow controller outlet.

The inlet is provided with an injection port located proximate an ion beam extraction aperture and receives the metered volume from the mass flow controller. The injection port is positioned near the extraction aperture so that the ion beam and the water vapor interact to neutralize the ion beam. The improved ion beam neutralizer is especially effective in low energy (less than ten kilo-electron volts (10 KeV)) beam applications.

DETAILED DESCRIPTION OF A PREFERRED EMBODIMENT

Figure 1:
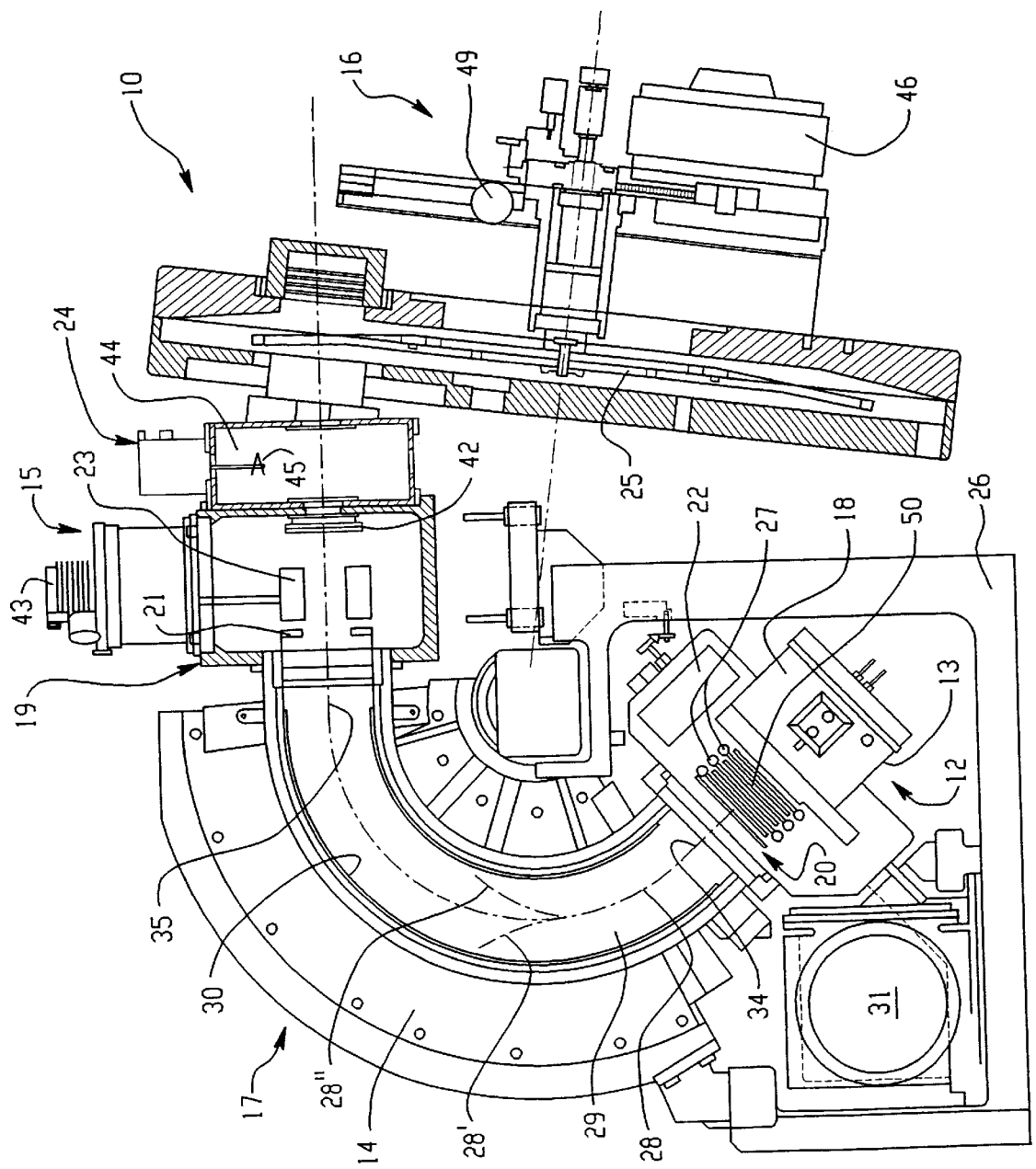
FIG. 1 is a perspective view of an ion implantation system into which is incorporated one embodiment of an ion beam neutralization system constructed according to the principles of the present invention.

Referring now to the drawings, FIG. 1 discloses an ion implanter, generally designated 10, which comprises an ion source 12, a mass analysis magnet 14, a beamline assembly 15, and a target or end station 16. The ion source 12 and the mass analysis magnet 14, along with their respective power supplies, are collectively referred to as a terminal 17. One application of the present invention is in a low energy implanter, such as that shown in FIG. 1, wherein the beamline assembly 15 is relatively short due to the tendency of a low energy beam to expand (i.e., "blow-up") during propagation thereof.

The ion source 12 comprises a housing 13 which defines a plasma chamber 18, an ion extractor assembly 20, and a source ion beam neutralizer 22 constructed according to the principles of the present invention. The beamline assembly 15 includes (i) a resolver housing 19 which is evacuated by vacuum pump 43 and which contains a terminal aperture 21, a resolving aperture 23, and a flag Faraday 42, and (ii) a downstream beam neutralizer 24 which contains an electron shower 45, none of which form a part of the present invention. Downstream of the beam neutralizer 24 is the end station 16, which includes a disk-shaped wafer support 25 upon which wafers to be treated are mounted. As used herein, wafer shall include any type of substrate which may be implanted with an ion beam. The wafer support 25 resides in a target plane which is (generally) perpendicularly orientated to the direction of the implant beam.

An ion beam 28 output by the ion source 12 travels to the mass analysis magnet 14 which functions to pass only ions of an appropriate charge-to-mass ratio to the beamline assembly 15. The mass analysis magnet 14 includes a curved beam path 29 which is defined by an aluminum beam guide 30 connected to the source 12, evacuation of which is provided by a vacuum pumps 31 and 43. The ion beam 28 which propagates along this path is affected by the magnetic field generated by the mass analysis magnet 14. The magnetic field causes the ion beam 28 to move along the curved beam path 29, from a first or entrance trajectory 34 near the ion source 12 to a second or exit trajectory 35 near the resolving housing 19. Portions 28' and 28" of the beam 28 comprised of ions having an inappropriate charge-to-mass ratio are deflected away from the curved trajectory and into the walls of aluminum beam guide 30. In this manner, the magnet 14 passes to the beamline assembly 15 only those ions in the beam 28 which have the desired charge-to-mass ratio.

The disc shaped wafer support 25 at the end station 16 is rotated by motor 46. The ion beam thus strikes wafers mounted to the support as they move in a circular path. The end station 16 is pivotable about two axes: one which is normal to the path of the ion beam and one which crosses the nominal beam-target intersection. In this manner, the angle of ion implantation may be slightly modified from the normal. As is known in the art, the disk shaped support 25 is rotated at a constant angular velocity by motor 47, and support 25 is moved vertically (into and out of the page of FIG. 1) by motor 49 and a lead screw (not shown).

The ion beam neutralizer 22 of the present invention is incorporated into the source region of the implanter 10 of FIG. 1. The ion source 12 is mounted to an L-shaped frame 26. Ionizable dopant gas, which is obtained either directly in the form of a compressed gas or indirectly from a solid form which has been vaporized, is injected into the plasma chamber 18. Typical source elements are boron (B), phosphorous (P), gallium (Ga), indium (In), antimony (Sb), and arsenic (As). Most of these source elements are provided in solid form, except boron, which is typically provided in the form of gaseous boron trifluoride or diborane.

Energy is imparted to the ionizable dopant gas to generate ions within the plasma chamber 18. Generally, positive ions are generated, although the present invention is applicable to systems wherein negative ions are generated by the source. The positive ions are extracted through a slit in the plasma chamber 18 by the ion extractor assembly 20 which comprises a plurality of electrodes 27. Accordingly, the ion extractor assembly functions to extract the beam 28 of positive ions from the plasma chamber through an extraction aperture 50 and accelerate the extracted ions toward the mass analysis magnet 14.

Figure 2:
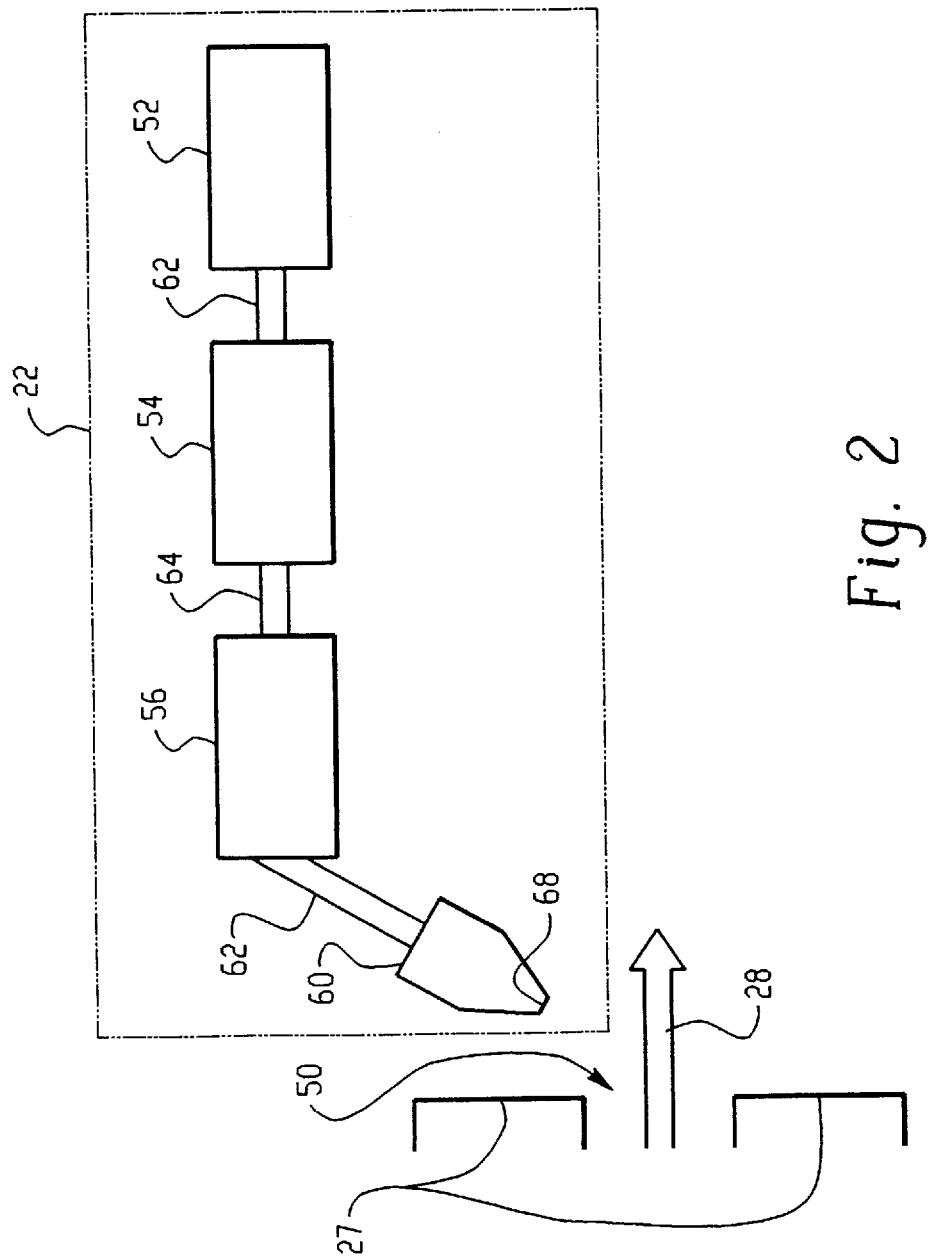
FIG. 2 is a schematic view of the ion beam neutralization system of FIG. 1.

FIG. 2 schematically shows the source ion beam neutralizer 22 constructed according to the principles of the present invention. The neutralizer comprises a source of water 52, a vaporizer 54, a mass flow controller 56, and an inlet 60. The source of water 52 is connected to the vaporizer 54 by conduit 62, the vaporizer 54 is connected to the mass flow controller 56 by conduit 64, and the mass flow controller 56 is connected to the inlet 60 by conduit 66. The inlet 60 is provided with an injection port 68 which is located proximate the extraction aperture 50 of the electrodes 27.

The vaporizer 54 converts water from the source 52 from a liquid state to a vapor state. The mass flow controller 56 operates as is known in the art, metering the volume of water vapor output by the outlet conduit 66 to the inlet 60.

The mass flow controller thereby controls the pressure of the water vapor within the beam guide 30, up to pressures on the order of $10^{-3}$ Torr. The water vapor is therefore responsible for the predominant pressure in the beam guide 30.

Because the injection port 68 of the inlet 60 is located near the ion beam extraction aperture 50, water vapor is introduced (bled) into the implanter beamline where beam current (intensity), and the space charge effect, is greatest. As such, interaction of the water vapor with the ion beam 28 is maximized. The water vapor molecules provide a higher likelihood of collision with the beam molecules than do other known gases introduced by conventional bleed systems. The interaction of the water vapor and the ion beam results in a reduced charge exchange effect, as opposed to conventional nitrogen gas bleeding systems. In addition, the interaction of the water vapor and the ion beam results in the creation of negatively charged OH⁻ ions which function to better neutralize the ion beam than negatively charged electrons ions provided by conventional nitrogen gas bleeding systems.

Reduced charge exchange effect results from the fact that (i) fewer electrons are acquired by the highly energetic positively charged ions comprising the ion beam, and (ii) fewer electrons are lost by the non-energetic neutral residual background gas. Thus, fewer energetic neutral ion beam particles are produced along with fewer slow moving, non-energetic, positively charged background gas ions. Because fewer energetic neutral beam particles are produced, the tendency of the mass analysis magnet to stop such particles and cause a corresponding reduction in beam current is lessened. In the case of a boron ion beam, this reduced charge effect has been found to be maintainable at beamline pressures of up to $10^{-3}$ Torr.

Negatively charged OH⁻ ions, which are created by the interaction of the beam with the water vapor, further function to neutralize the beam. The OH⁻ ions are produced as a result of the negative chemical natures of hydroxide radicals. The resulting beam plasma is comprised of OH⁻ ions, electrons, positively charged beam ions, and some slow moving, non-energetic, positively charged background gas ions. Although both the OH⁻ and the electrons serve to neutralize the positively charged beam, the OH⁻ are much heavier than the electrons. As such, the relatively sizable OH⁻ acquire comparatively small velocities, as a result of interaction within the beam plasma, as opposed to the electrons. Therefore, the OH⁻ ions stay within the confines of the beam much longer than electrons, which are more likely to gain energy or heat and, thus, are more likely to escape the beam. By remaining within the confines of the ion beam, the OH⁻ better function to reduce the space charge effect on the ion beam.

Both the formation of OH⁻ and the reduced charge exchange effect make water vapor more effective at neutralizing an ion beam rather than other known gases. The invention has been found to be especially effective at neutralizing low energy (less than 10 KeV) boron ion beams. In very low energy applications (less than 5 KeV) boron beams have been found to undergo a 40% increase in intensity (beam current) as opposed to conventional nitrogen gas bleeding systems.

Accordingly, a preferred embodiment of system and method for neutralizing an ion beam in an ion implanter using water vapor has been described. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

What we claim is:

1. An ion beam neutralizer (22) for neutralizing the electrical charge of an ion beam (28) output from an extraction aperture (50) of an ion source (12), comprising:

a source of water (52);

a vaporizer (54) connected to said source of water (52) for converting water from said source of water (52) from a liquid state to a vapor state;

a mass flow controller (56) connected to said vaporizer (54) and having an inlet (64) and an outlet (66), said mass controller operating to meter the volume of water vapor output by said outlet (66); and an injection port (68) connected to said mass flow controller outlet (66) for receiving the metered output of said outlet, said injection port located proximate said ion beam extraction aperture (50), such that said ion beam and said water vapor interact to neutralize the ion beam.

2. The ion beam neutralizer (22) of claim 1, wherein said ion beam (28) is comprised primarily of boron ions and neutral particles.

3. The ion beam neutralizer (22) of claim 2, wherein said ion beam (28) resides at an energy level of less than ten kilo-electron volts (10 KeV).

4. The ion beam neutralizer (22) of claim 1, further comprising a beam guide (30) attached to said ion source (12), wherein said mass flow controller (56) controls the pressure of water vapor within the beam guide.

5. The ion beam neutralizer (22) of claim 4, wherein said mass flow controller controls the pressure of the water vapor within the beam guide (30) to a pressure on the order of $10^{-3}$ Torr.

6. An ion implanter terminal (17) comprising:

an ion source (12) for outputting an ion beam (28), said ion source including an extractor assembly (20) comprised of at least one electrode (27) providing an extraction aperture (50);

a beam guide (30) connected to said ion source for receiving the ion beam output by said ion source; and an ion beam neutralizer (22) for neutralizing the electrical charge of the ion beam (28) extracted from said extraction aperture (50), said neutralizer (22) comprising:

a source of water (52);

a vaporizer (54) connected to said source of water (52) for converting water from said source of water (52) from a liquid state to a vapor state;

a mass flow controller (56) connected to said vaporizer (54) and having an inlet (64) and an outlet (66), said mass controller operating to meter the volume of water vapor output by said outlet (66); and an injection port (68) connected to said mass flow controller outlet (66) for receiving the metered output of said outlet, said injection port located proximate said extraction aperture (50), such that said ion beam and said water vapor interact to neutralize the ion beam.

7. The terminal (17) of claim 6, wherein said ion beam (28) is comprised primarily of boron ions and neutral particles.

8. The terminal (17) of claim 7, wherein said ion beam (28) resides at an energy level of less than ten kilo-electron volts (10 KeV).

9. The terminal (17) of claim 6, wherein said mass flow controller (56) controls the pressure of water vapor within the beam guide.

10. The terminal (17) of claim 9, wherein said mass flow controller controls the pressure of the water vapor within the beam guide (30) to a pressure on the order of $10^{-3}$ Torr.

11. A method of neutralizing an ion beam (28) comprising the steps of:

generating the ion beam (28) from a source (12);

extracting the ion beam through an extraction aperture (50) in an extractor assembly (20);

directing the ion beam toward a beam guide (30) connected to said ion source; and neutralizing the ion beam by bleeding water vapor near the ion beam subsequent to its extraction through the extraction aperture but prior to its entry into the beam guide (30).

12. The method of claim 11, wherein the step of neutralizing the ion beam is performed using an ion beam neutralizer (22) comprising:

a source of water (52);

a vaporizer (54) connected to said source of water (52) for converting water from said source of water (52) from a liquid state to a vapor state;

a mass flow controller (56) connected to said vaporizer (54) and having an inlet (64) and an outlet (66), said mass controller operating to meter the volume of water vapor output by said outlet (66); and an injection port (68) connected to said mass flow controller outlet (66) for receiving the metered output of said outlet, said injection port located proximate said extraction aperture (50), such that said ion beam and said water vapor interact to neutralize the ion beam.

13. The method of claim 12, wherein said ion beam (28) is comprised primarily of boron ions and neutral particles.

14. The method of claim 13, wherein said ion beam (28) resides at an energy level of less than ten kilo-electron volts (10 KeV).

15. The method of claim 12, wherein said mass flow controller (56) controls the pressure of water vapor within the beam guide.

16. The method of claim 15, wherein said mass flow controller controls the pressure of the water vapor within the beam guide (30) to a pressure on the order of $10^{-3}$ Torr.

* * * * *